(12) United States Patent
Park et al.

(10) Patent No.: US 9,281,126 B2
(45) Date of Patent: Mar. 8, 2016

(54) MULTILAYER CERAMIC CAPACITOR AND BOARD FOR MOUNTING THE SAME

(71) Applicant: SAMSUNG ELECTRO-MECHANICS CO., LTD., Suwon, Gyunggi-do (KR)

(72) Inventors: Min Cheol Park, Gyunggi-do (KR); Heung Kil Park, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 108 days.

(21) Appl. No.: 14/067,785

(22) Filed: Oct. 30, 2013

(65) Prior Publication Data

US 2015/0014036 A1    Jan. 15, 2015

(30) Foreign Application Priority Data

Jul. 15, 2013    (KR) .......................... 10-2013-0082818

(51) Int. Cl.
*H01G 4/06* (2006.01)
*H01G 4/30* (2006.01)
(Continued)

(52) U.S. Cl.
CPC .................. *H01G 4/30* (2013.01); *H01G 4/012* (2013.01); *H01G 4/232* (2013.01); *H05K 1/0231* (2013.01); *H05K 1/0268* (2013.01); *H05K 1/181* (2013.01); *H05K 3/3442* (2013.01); *H05K 2201/10015* (2013.01); *H05K 2201/10636* (2013.01)

(58) Field of Classification Search
CPC ......... H01G 4/005; H01G 4/06; H01G 4/228; H01G 4/232; H01G 4/12; H01G 4/012; H01G 4/30; H05K 1/0231; H05K 1/181; H05K 1/18; H01C 1/148; H01C 7/18; H01C 7/13; H01L 41/0471; H01L 41/047; Y10T 29/435
USPC ................ 174/260; 361/301.4, 306.3, 321.1, 361/321.3, 321.2, 306.1, 305, 311, 309, 361/303; 310/366; 338/22 R; 29/25.42
See application file for complete search history.

(56) References Cited

U.S. PATENT DOCUMENTS

2008/0310077 A1*  12/2008  Itamura et al. ............. 361/306.3
2009/0086403 A1*  4/2009   Lee ......................... H01G 4/012
                                                    361/301.4
(Continued)

FOREIGN PATENT DOCUMENTS

JP    2006-237234 A    9/2006
KR    10-2010-0068056 A    6/2010

*Primary Examiner* — Timothy Thompson
*Assistant Examiner* — Guillermo Egoavil
(74) *Attorney, Agent, or Firm* — McDermott Will & Emery LLP

(57) ABSTRACT

There is provided a multilayer ceramic capacitor including a ceramic body including a plurality of dielectric layers and having first and second main surfaces, first and second side surfaces, and first and second end surfaces, a capacitor part formed in the ceramic body and including a first internal electrode exposed to the first and second end surfaces and a second internal electrode having a lead-out portion exposed to the first main surface, an internal connection conductor formed in the ceramic body and exposed to the first and second main surfaces, and first to fourth external electrodes formed on outer surfaces of the ceramic body and electrically connected to the first and second internal electrodes and the internal connection conductor, wherein the internal connection conductor is connected to the capacitor part in series.

19 Claims, 11 Drawing Sheets

A-A'

(51) Int. Cl.
*H05K 1/02* (2006.01)
*H01G 4/012* (2006.01)
*H01G 4/232* (2006.01)
*H05K 1/18* (2006.01)
*H05K 3/34* (2006.01)

(56) References Cited

U.S. PATENT DOCUMENTS

| | | | |
|---|---|---|---|
| 2009/0086406 A1* | 4/2009 | Lee | H01G 4/228 361/306.3 |
| 2009/0244807 A1* | 10/2009 | Lee | H01G 4/005 361/306.2 |
| 2009/0323253 A1* | 12/2009 | Kobayashi et al. | 361/301.4 |
| 2010/0149769 A1 | 6/2010 | Lee et al. | |
| 2010/0238605 A1* | 9/2010 | Lee | H01G 2/065 361/306.3 |
| 2010/0271751 A1* | 10/2010 | Sasabayashi | 361/301.4 |
| 2013/0033154 A1* | 2/2013 | Sakuratani et al. | 310/366 |
| 2013/0050897 A1* | 2/2013 | Kim | 361/321.2 |
| 2013/0155574 A1* | 6/2013 | Park | H01G 4/012 361/321.3 |

\* cited by examiner

MULTILAYER CERAMIC CAPACITOR AND BOARD FOR MOUNTING THE SAME

CROSS-REFERENCE TO RELATED APPLICATION

This application claims the benefit of Korean Patent Application No. 10-2013-0082818 filed on Jul. 15, 2013, with the Korean Intellectual Property Office, the disclosure of which is incorporated herein by reference.

BACKGROUND OF THE INVENTION

1. Field of the Invention

The present invention relates to a multilayer ceramic capacitor and a board for mounting the same.

2. Description of the Related Art

A multilayer ceramic capacitor, a multilayer chip electronic component, is a capacitor having a chip form mounted on a printed circuit board of an imaging device such as a liquid crystal display (LCD), a plasma display panel (PDP), and the like and various electronic products such as a computer, a smart phone, a mobile phone, and the like to thereby serve to charge or discharge electricity.

The above-mentioned multilayer ceramic capacitor (MLCC) may be used as a component of various electronic devices due to advantages such as a small size, high capacitance, easiness of mounting, or the like.

The multilayer ceramic capacitor may have a structure in which a plurality of dielectric layers and internal electrodes having different polarities from each other, having the dielectric layer interposed therebetween, are alternately stacked.

Particularly, a power supplying apparatus for a central processing unit (CPU) of a computer or the like may generate voltage noise due to a rapid change in a load current while a low level of voltage is supplied thereto.

Therefore, the multilayer capacitor has been widely used in the power supplying apparatus as a decoupling capacitor for the purpose of suppressing the voltage noise as described above.

The decoupling multilayer ceramic capacitor is required to have a lower equivalent series inductance (ESL) value as an operating frequency is increased. Therefore, research into decreasing the above mentioned ESL has been actively conducted.

In addition, in order to stably supply power, the decoupling multilayer ceramic capacitor is required to have adjustable equivalent series resistor (ESR) characteristics.

When the equivalent series resistor (ESR) value of the multilayer ceramic capacitor is lower than a required level, an impedance peak in a parallel resonance frequency caused by the ESL of the capacitor and plane capacitance of a microprocessor package may be increased and impedance in a serial resonance frequency of the capacitor may be excessively decreased.

Therefore, in order to enable a user to implement flat impedance characteristics of a power distribution network, the ESR characteristics of the decoupling multilayer ceramic capacitor need to be easily adjusted and provided.

In relation to the ESR adjustment, a method using a material having high electrical resistance for an external electrode and an internal electrode may be considered. The method using change in materials as described above may provide high ESR characteristics while maintaining a typical low ESL structure.

However, when a highly resistive material is used in the external electrode, a localized heat spot caused by a current concentration phenomenon due to a pin hole may occur. In addition, when the highly resistive material is used in the internal electrode, the material of the internal electrode should also be continuously changed for matching a ceramic material according to high capacitance.

Therefore, because the ESR adjustment method according to the related art has the disadvantages as described above, research into the multilayer ceramic capacitor capable of adjusting the ESR remains required.

In addition, a microprocessor has also been switched to a miniaturized, highly-integrated product, in accordance with the recent trend for rapid development of mobile terminals such as tablet PCs, ultrabooks, and the like.

Thereby, an area of the printed circuit board is decreased and a space for mounting the decoupling capacitor is also similarly limited. As a result, the multilayer ceramic capacitor capable of satisfying the decreased and the limited space has been continuously required.

RELATED ART DOCUMENT

Korean Patent Laid-Open Publication No. 2010-0068056

SUMMARY OF THE INVENTION

An aspect of the present invention provides a multilayer ceramic capacitor and a board for mounting the same.

According to an aspect of the present invention, there is provided a multilayer ceramic capacitor, including: a ceramic body including a plurality of dielectric layers and having first and second main surfaces opposing each other in a thickness direction of the ceramic body, first and second side surfaces opposing each other in a width direction thereof, and first and second end surfaces opposing each other in a length direction thereof; a capacitor part formed in the ceramic body and including a first internal electrode exposed to the first and second end surfaces and a second internal electrode having a lead-out portion exposed to the first main surface; an internal connection conductor formed in the ceramic body and exposed to the first and second main surfaces; and first to fourth external electrodes formed on outer surfaces of the ceramic body and electrically connected to the first and second internal electrodes and the internal connection conductor, wherein the internal connection conductor is connected to the capacitor part in series.

The first and second external electrodes may be disposed on the first and second end surfaces of the ceramic body opposing each other, and the third and fourth external electrodes may be disposed on the first and second main surfaces of the ceramic body opposing each other.

The internal connection conductor may be connected to the second internal electrode through the fourth external electrode.

The ceramic body may further include a dummy pattern formed on the first main surface.

An equivalent series resistor (ESR) of the multilayer ceramic capacitor may be adjusted by the internal connection conductor.

The first internal electrode may be further exposed to the first and second main surfaces.

According to another aspect of the present invention, there is provided a multilayer ceramic capacitor, including: a ceramic body including a plurality of dielectric layers and having first and second main surfaces opposing each other in a thickness direction of the ceramic body, first and second side surfaces opposing each other in a width direction thereof, and first and second end surfaces opposing each other in a length direction thereof; a first capacitor part formed in the ceramic body and including a first internal electrode exposed to the first and second end surfaces and a second internal electrode having a lead-out portion exposed to the second main surface, and a second capacitor part including the second internal electrode and a third internal electrode having a lead-out portion exposed to the first main surface; an internal connection conductor formed in the ceramic body and exposed to the first and second main surfaces; and first to fourth external electrodes formed on outer surfaces of the ceramic body and electrically connected to the first to third internal electrodes and the internal connection conductor, wherein the internal connection conductor is connected to the second capacitor part in series.

The first and second external electrodes may be disposed on the first and second end surfaces of the ceramic body opposing each other, and the third and fourth external electrodes may be disposed on the first and second main surfaces of the ceramic body opposing each other.

The internal connection conductor may be connected to the second internal electrode through the third external electrode.

The internal connection conductor may be connected to the third internal electrode through the fourth external electrode.

The ceramic body may further include a dummy pattern formed on the first main surface.

An equivalent series resistor (ESR) of the multilayer ceramic capacitor may be adjusted by the internal connection conductor.

According to another aspect of the present invention, there is provided a board for mounting a multilayer ceramic capacitor, the board including: a printed circuit board having first and second electrode pads thereon; and the multilayer ceramic capacitor as described above, installed on the printed circuit board.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
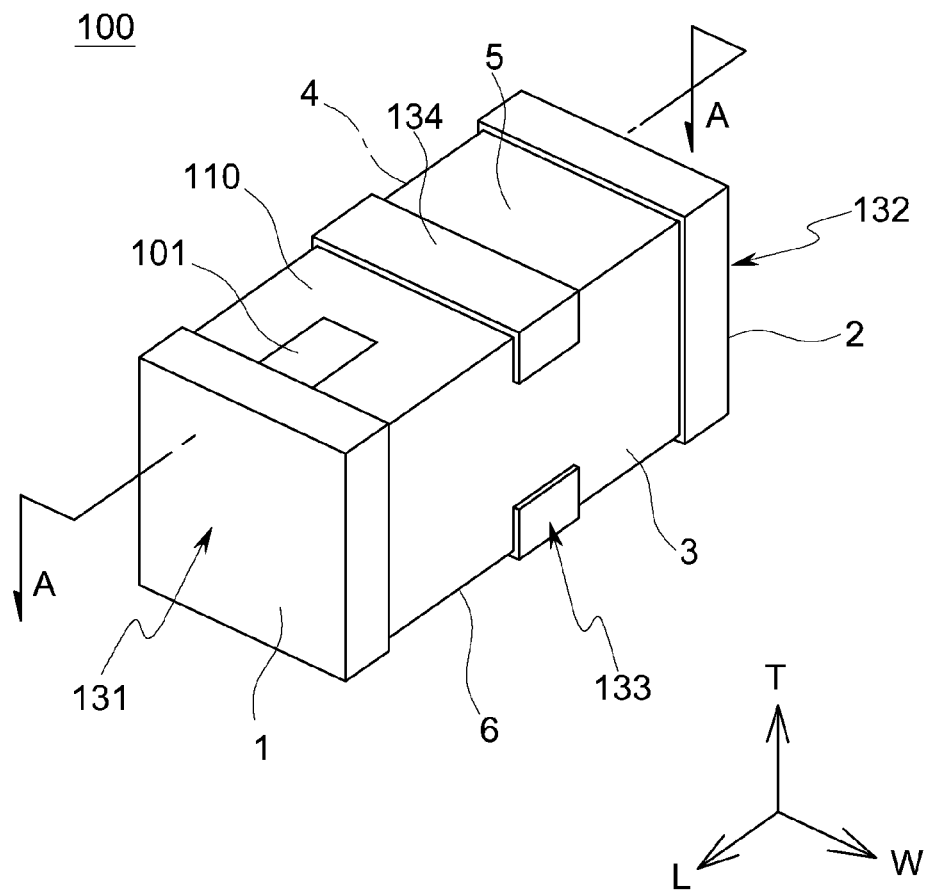
FIG. 1 is a perspective view of a multilayer ceramic capacitor according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

A direction of a hexahedron will be defined in order to clearly describe the embodiments of the present invention. L, W and T shown in FIG. 1 refer to a length direction, a width direction, and a thickness direction, respectively. Here, the thickness direction may be the same as a direction in which dielectric layers are stacked.

Multilayer Ceramic Capacitor

Embodiments of the present invention will now be described in detail with reference to the accompanying drawings.

FIG. 1 is a perspective view of a multilayer ceramic capacitor according to an embodiment of the present invention.

Figure 2:
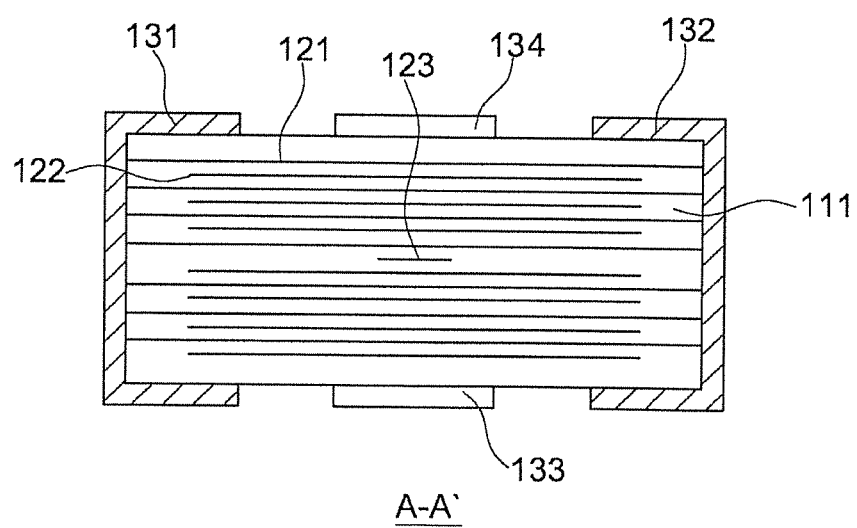
FIG. 2 is a cross-sectional view taken along line A-A' of FIG. 1.

FIG. 2 is a cross-sectional view taken along line A-A' of FIG. 1.

Referring to FIGS. 1 and 2, the multilayer ceramic capacitor 100 according to the embodiment of the present invention may include a plurality of dielectric layers 111 and may include a ceramic body 110 having first and second main surfaces opposing each other in a thickness direction of the ceramic body, first and second side surfaces opposing each other in a width direction thereof, and first and second end surfaces opposing each other in a length direction thereof.

According to the present embodiment, the ceramic body 110 may have first and second main surfaces 5 and 6 opposing each other, and first and second side surfaces 3 and 4 and first and second end surfaces 1 and 2 that connect the first and second main surfaces 5 and 6 to each other.

A shape of the ceramic body 110 is not particularly limited, but may be a hexahedral shape as shown in FIG. 1.

The multilayer ceramic capacitor according to the embodiment of the present invention may have the second main surface 6 provided as a mounting surface on a board, but is not limited thereto.

The ceramic body 110 may be formed by stacking a plurality of dielectric layers, and first and second internal electrodes 121 and 122 are disposed so as to be separate from each other, having the dielectric layer 111 interposed therebetween, in the ceramic body 100.

The plurality of dielectric layers 111 configuring the ceramic body 110 may be in a sintered state and be integrated with each other so as not to confirm a boundary between dielectric layers adjacent to each other without using a scanning electron microscope (SEM).

The dielectric layer 111 may be formed by firing a ceramic green sheet including a ceramic powder, an organic solvent, and an organic binder. As the ceramic powder, a high k material, that is, a barium titanate ($BaTiO_3$) based material, a strontium titanate ($SrTiO_3$) based material, or the like, may be used. However, the ceramic powder is not limited thereto.

The multilayer ceramic capacitor 100 may include a capacitor part including the first internal electrode 121 exposed to the first and second end surfaces 1 and 2 and the second internal electrode 122 having a lead-out portion 122a exposed to the first main surface 5, in the ceramic body.

According to the embodiment of the present invention, the first and second internal electrodes 121 and 122 may be formed of a conductive paste including a conductive metal.

The conductive metal may be nickel (Ni), copper (Cu), palladium (Pd), or an alloy thereof, but the present embodiment is not limited thereto.

The internal electrode may be printed on a ceramic green sheet configuring the dielectric layer using a conductive paste by a printing method such as a screen printing method or a gravure printing method.

The ceramic green sheets having the internal electrode printed thereon may be alternately stacked and fired to form the ceramic body.

In addition, the multilayer ceramic capacitor 100 may include an internal connection conductor 123 disposed to have the dielectric layer 111 therebetween in the ceramic body 110.

The internal connection conductor 123 is not particularly limited and may be formed of, for example, a conductive paste including a conductive metal similar to the first and second internal electrodes 121 and 122.

The conductive metal may be nickel (Ni), copper (Cu), palladium (Pd), or an alloy thereof, but is not limited thereto.

In addition, the multilayer ceramic capacitor 100 may include first to fourth external electrodes 131, 132, 133 and 134 formed on the outer surfaces of the ceramic body 110 and electrically connected to the first and second internal electrodes 121 and 122, and the internal connection conductor 123.

The first and second external electrodes 131 and 132 may be disposed on the first and second end surfaces 1 and 2 of the ceramic body 100, opposing each other, and the third and fourth external electrodes 133 and 134 may be disposed on the first and second main surfaces 5 and 6 opposing each other.

According to the embodiment of the present invention, it may be appreciated that two external electrodes 133 and 134 except for the first and second external electrodes 131 and 132 used as external terminals for a connection to a power line are used as external electrodes for adjusting ESR.

However, since the first and second external electrodes used as the external terminals may be arbitrarily selected so as to be suitable for ESR characteristics, they are not particularly limited.

In addition, the third and fourth external electrodes 133 and 134, the external electrodes for adjusting the ESR may be connected to a detecting circuit to be used in detecting a leak current.

The first to fourth external electrodes 131, 132, 133, and 134 may be formed of the conductive paste including a conductive metal.

The conductive metal may be nickel (Ni), copper (Cu), tin (Sn), or an alloy thereof, but is not limited thereto.

The conductive paste may further include an insulating material. The insulating material may be, for example, glass, but is not limited thereto.

A method of forming the first to fourth external electrodes 131, 132, 133, and 134 is not particularly limited. That is, the first to fourth external electrodes 131, 132, 133, and 134 may be formed by dipping the ceramic body or be formed by a method such as a plating method, or the like.

The multilayer ceramic capacitor according to the present embodiment may be a third-terminal vertically laminated or vertical multilayer capacitor. The term "vertically laminated or vertical multilayer" means that the internal electrodes stacked within the capacitor are disposed to be perpendicular with regard to a mounting area surface of a circuit board, and the term "three-terminal" means that three terminals of the capacitor are connected to the circuit board.

According to the embodiment of the present invention, the ceramic body 110 may have a dummy pattern 101 further formed on the first main surface 5.

The dummy pattern 101 may be used to recognize amounting direction at the time of mounting the multilayer ceramic capacitor on the circuit board, and is not limited in terms of a material, a position or a size thereof.

A method of forming the dummy pattern 101 is not particularly limited. That is, the dummy pattern 101 may be formed by adding a pattern on an upper end portion of the dielectric layer 111 corresponding to the first main surface 5 of the ceramic body 110 during forming an electrode pattern on the dielectric layer 111 as in a description below.

Figure 3A:
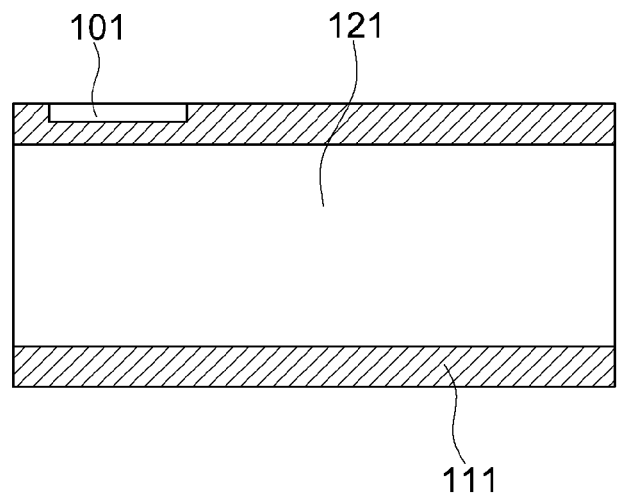
FIGS. 3A and 3B are plan views showing first and second internal electrodes usable in the multilayer ceramic capacitor shown in FIG. 1.
Figure 3B:
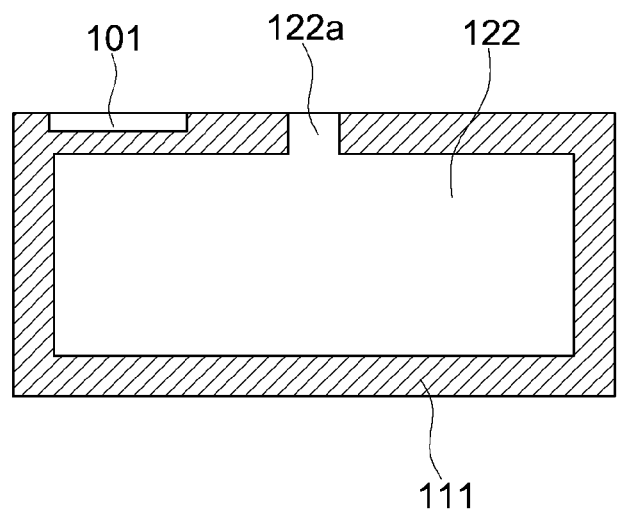

FIGS. 3A and 3B are plan views showing first and second internal electrodes usable in the multilayer ceramic capacitor shown in FIG. 1.

Figure 4:
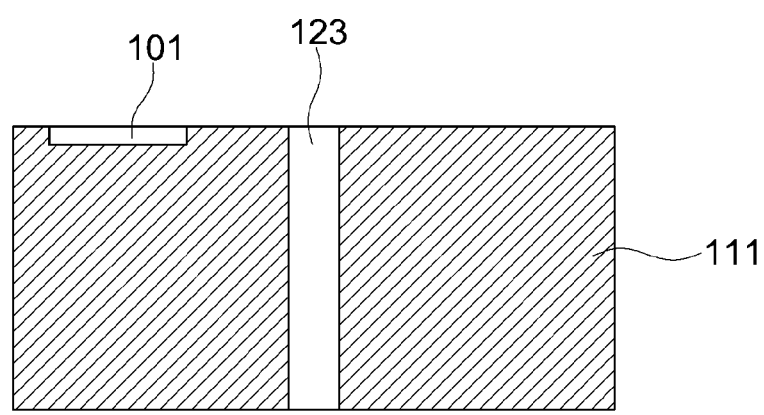
FIG. 4 is a plan view showing an internal connection conductor usable together with the first and second internal electrodes shown in FIGS. 3A and 3B.

FIG. 4 is a plan view showing an internal connection conductor usable together with the first and second internal electrodes shown in FIGS. 3A and 3B.

Hereinafter, the internal electrodes 121 and 122, the internal connection conductor 123, and the external electrodes 131, 132, 133, and 134 of the multilayer ceramic capacitor 100 according to the embodiment of the present invention will be described in detail with reference to FIGS. 2 through 4.

The capacitor part may include the first internal electrode 121 exposed to the first and second end surfaces 1 and 2 and the second internal electrode 122 having the lead-out portion 122a exposed to the first main surface 5, in the ceramic body 110, to form capacitance.

The capacitor part may be disposed in the ceramic body 110 without being particularly limited and a plurality of capacitor parts may be stacked in order to implement a target capacitance value.

The first and second internal electrodes 121 and 122 and the internal connection conductor 123 may be alternately disposed, having the dielectric layer 111 interposed therebetween.

Although FIGS. 3A and 3B show one first internal electrode 121 and one second internal electrode 122, the internal electrode in a specific group may be provided in plural in an actually applied form.

Similarly, although FIG. 4 shows one internal connection conductor 123, the internal connection conductor having at least one polarity may be provided in plural.

Meanwhile, the stacking thereof may be performed according to an order as illustrated in FIGS. 3 and 4, but may be performed in various orders.

For example, as shown in FIG. 2, the internal connection conductor 123 may be disposed to be interposed between a plurality of internal electrodes.

Specifically, by changing a width, a length, and an amount of layers of the internal connection conductors 123, the ESR characteristics may be precisely adjusted.

According to the embodiment of the present invention, the internal connection conductor 123 may be connected to the second internal electrode 122 through the fourth external electrode 134.

According to the embodiment of the present invention, the equivalent series resistor (ESR) of the multilayer ceramic capacitor 100 may be adjusted by the internal connection conductor 123.

By adjusting the equivalent series resistor (ESR) of the multilayer ceramic capacitor 100 using the internal connection conductor 123 as described above, an increase in the impedance in a high frequency region may be prevented, such that an influence caused by a decrease in ripple removal effect or a noise removal effect may be decreased.

In addition, the ESR may exhibit an excellent effect as a resistor having a region also facilitating detection of a leak current or an over-current.

The present embodiment is not limited to the pattern shape of the internal connection conductor 123 shown in FIG. 4, and the internal connection conductor 123 may have various pattern shapes in order to adjust ESR.

For example, the internal connection conductor 123 may have the same pattern shape as those of the first and second internal electrodes 121 and 122 shown in FIGS. 3A and 3B.

According to the embodiment of the present invention, the equivalent series resistor (ESR) of the multilayer ceramic capacitor may be adjusted by the internal connection conductor 123, and may be connected to the detecting circuit and used for detecting leak current.

In addition, the internal connection conductor 123 may be connected to the capacitor part in series.

By the connection described above, the internal connection conductor 123 may adjust the equivalent series resistor (ESR) of the multilayer ceramic capacitor, and may be connected to the detecting circuit and used for detecting leak current.

In addition, according to the related art, although a separate external resistor is required to detect leak current, according to the embodiment of the present invention, the leak current may be detected using the internal resistor provided in the multilayer ceramic capacitor 100 such that the manufacturing costs and the mounting space for the component may be decreased.

Figure 5A:
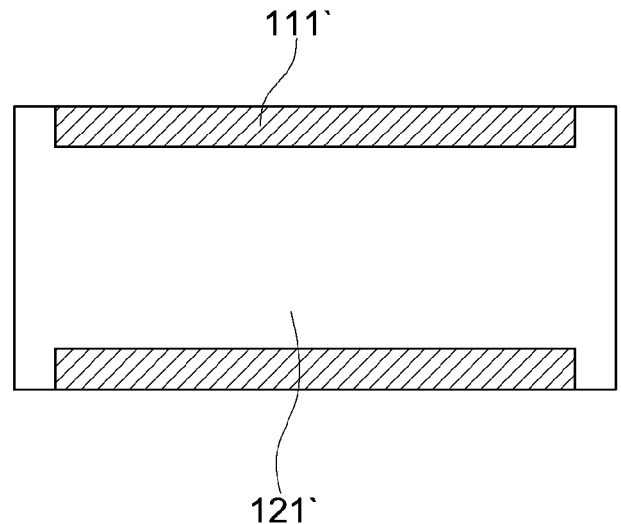
FIGS. 5A and 5B are plan views showing first and second internal electrodes according to another embodiment of the present invention, usable in the multilayer ceramic capacitor shown in FIG. 1.
Figure 5B:
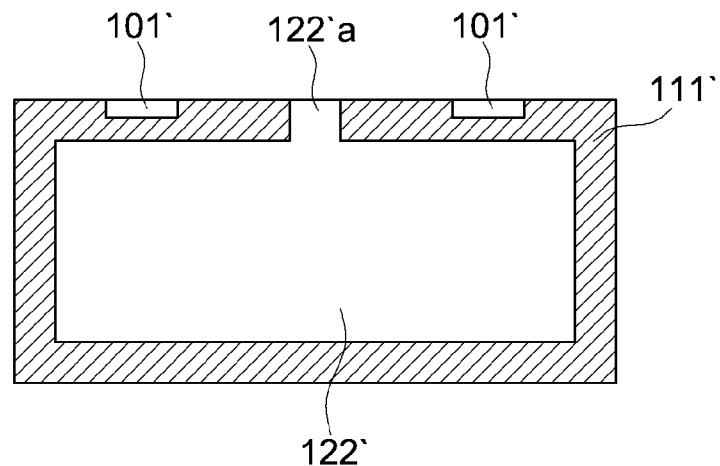

FIGS. 5A and 5B are plan views showing first and second internal electrodes according to another embodiment of the present invention, usable in the multilayer ceramic capacitor shown in FIG. 1.

Figure 6:
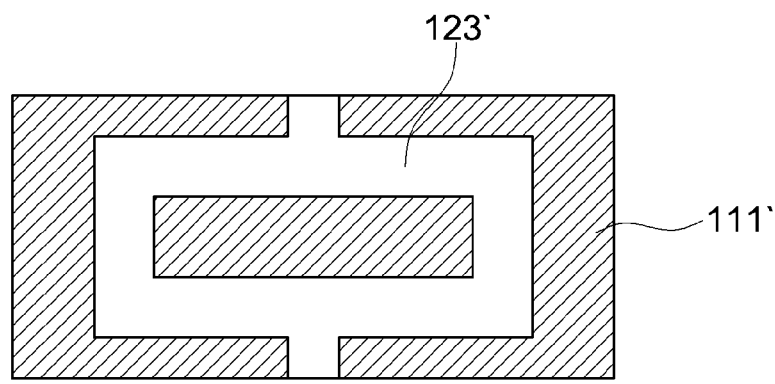
FIG. 6 is a plan view showing an internal connection conductor usable together with the first and second internal electrodes shown in FIGS. 5A and 5B.

FIG. 6 is a plan view showing an internal connection conductor usable together with the first and second internal electrodes shown in FIGS. 5A and 5B.

Referring to FIGS. 5A to 6, the multilayer ceramic capacitor according to another embodiment of the present invention may include first and second internal electrodes 121' and 122' and an internal connection conductor 123' having a pattern shape different from that according to the embodiment of the present invention described above.

The first and second internal electrodes 121' and 122' and the internal connection conductor 123' may be disposed to be separated from each other, having the dielectric layer 111' interposed therebetween.

According to another embodiment of the present invention, the first internal electrode 121' may be further exposed to the first and second main surfaces 5 and 6 as well as to the first and second end surfaces 1 and 2.

Thereby, a current path may be shortened, such that a value of an equivalent series inductance (ESL) may be decreased.

In addition, similar to the embodiment of the present invention described above, a dummy pattern 101' may be formed, and as shown in FIGS. 5A and 5B, two dummy patterns may be formed, but the number of the dummy patterns is not particularly limited.

Figure 7:
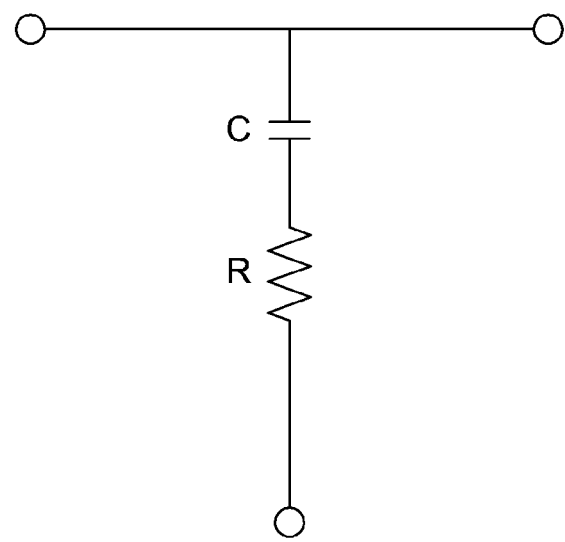
FIG. 7 is an equivalent circuit diagram of the multilayer ceramic capacitor shown in FIG. 1.

FIG. 7 is an equivalent circuit diagram of the multilayer ceramic capacitor shown in FIG. 1.

Referring to FIG. 7, the capacitor part including the first internal electrode 121 and the second internal electrode 122, and the internal connection conductor 123 may be connected to each other in series.

The multilayer ceramic capacitor according to the embodiment of the present invention as described above may have one type of capacitor and one resistor, and may control the respective values thereof.

The multilayer ceramic capacitor according to the embodiment of the present invention has the structure including the internal electrodes 121 and 122, the internal connection conductor 123, and the external electrodes 131, 132, 133, and 134 as described above, such that the decrease and the adjustment in the impedance may be easily carried out in the frequency region wider than the structure according to the related art and the mounting space and costs may be decreased according to the decrease in the components.

In addition, the ESR may be controlled in the multilayer ceramic capacitor, a main component in a power integrity design, such that it may be effective in the power integrity design.

In addition, unlike the related art, leak current may be detected using the internal resistor in the multilayer ceramic capacitor, such that the manufacturing cost and the mounting space for the component may be decreased.

Figure 8:
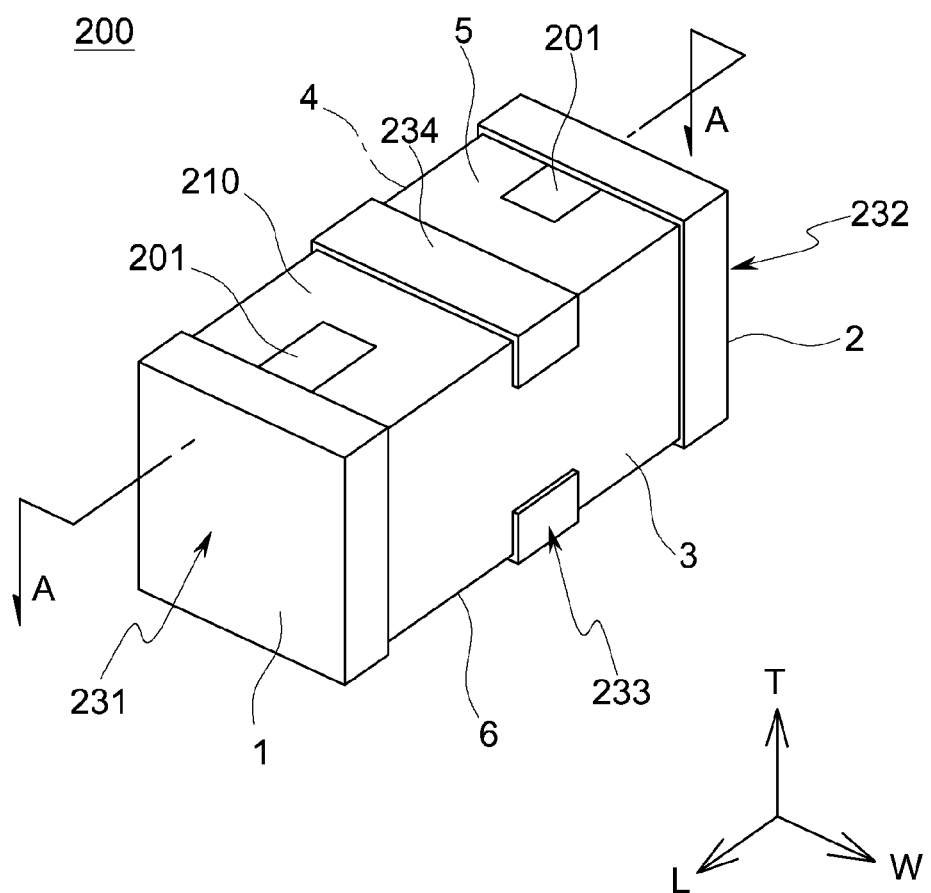
FIG. 8 is a perspective view of a multilayer ceramic capacitor according to another embodiment of the present invention.

FIG. 8 is a perspective view of a multilayer ceramic capacitor according to another embodiment of the present invention.

Figure 9:
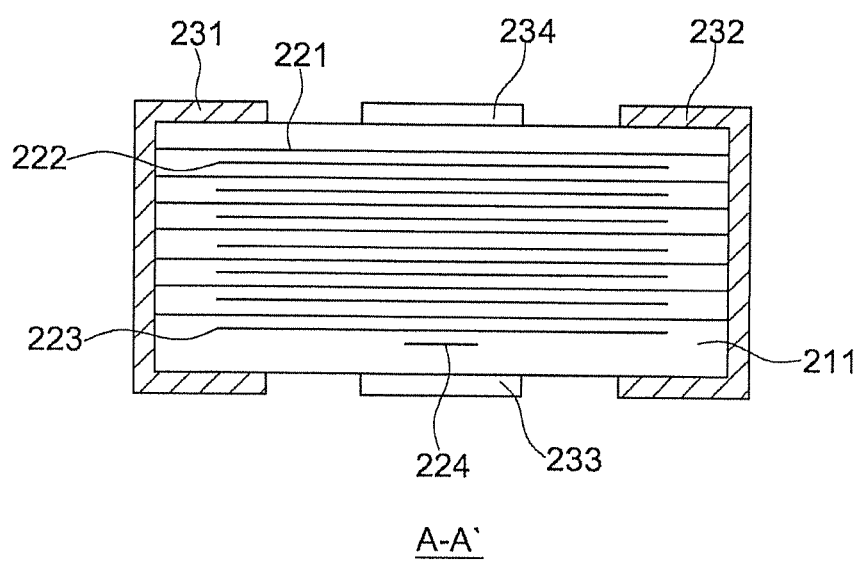
FIG. 9 is a cross-sectional view taken along line A-A' of FIG. 8.

FIG. 9 is a cross-sectional view taken along line A-A' of FIG. 8.

Referring to FIGS. 8 and 9, a multilayer ceramic capacitor 200 according to another embodiment of the present invention includes a plurality of dielectric layers 211, and includes a ceramic body 210 having first and second main surfaces 5 and 6 opposing each other in a thickness direction of the ceramic body, first and second side surfaces 3 and 4 opposing each other in a width direction thereof, and first and second end surfaces 1 and 2 opposing each other in a length direction thereof; a first capacitor part formed in the ceramic body 210 and having a first internal electrode 221 exposed to the first and second end surfaces 1 and 2 and a second internal electrode 222 having a lead-out portion 222a exposed to the second main surface 6, and a second capacitor part including the second internal electrode 222 and a third internal electrode 223 having a lead-out portion 223a exposed to the first main surface 5; an internal connection conductor 224 formed in the ceramic body 210 and exposed to the first and second main surfaces 5 and 6; and first to fourth external electrodes 231, 232, 233, and 234 formed on outer surfaces of the ceramic body 210 and electrically connected to the first to third internal electrodes 221, 222, and 223 and the internal connection conductor 224, wherein the internal connection conductor 224 may be connected to the second capacitor part in series.

Hereinafter, the multilayer ceramic capacitor according to another embodiment of the present invention will be described. However, the same description as that of the multilayer ceramic capacitor according to the foregoing embodiment of the present invention will be omitted in order to avoid an overlap thereof.

According to another embodiment of the present invention, the internal connection conductor 224 may be connected to the second internal electrode 222 through the third external electrode 233.

According to another embodiment of the present invention, the internal connection conductor 224 may be connected to the third internal electrode 223 through the fourth external electrode 234.

According to another embodiment of the present invention, the ceramic body 210 may further include a dummy pattern 201 formed on the first main surface 5.

Figure 10A:
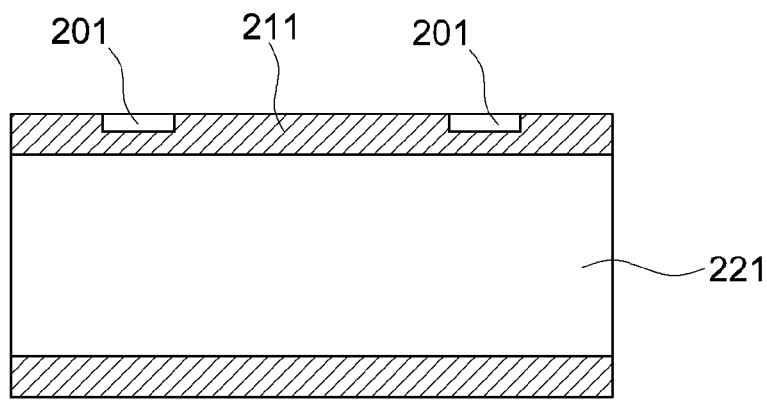
FIGS. 10A through 10C are plan views showing first to third internal electrodes usable in the multilayer ceramic capacitor shown in FIG. 8.
Figure 10B:
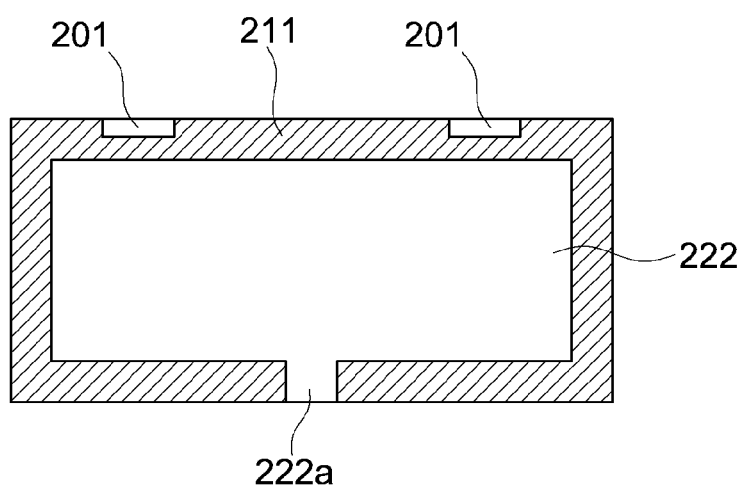
Figure 10C:
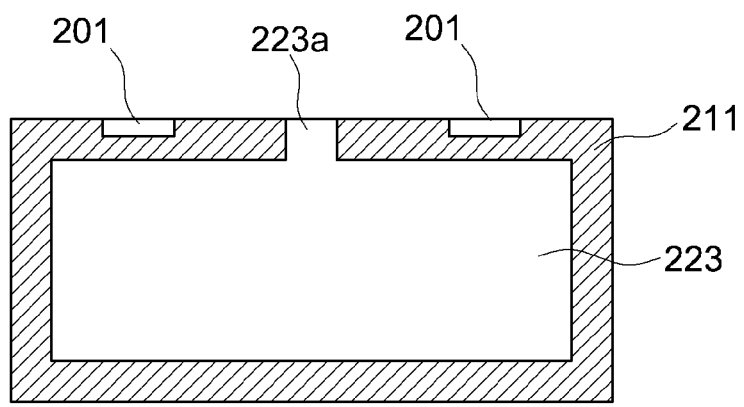

FIGS. 10A through 10C are plan views showing first to third internal electrodes usable in the multilayer ceramic capacitor shown in FIG. 8.

Figure 11:
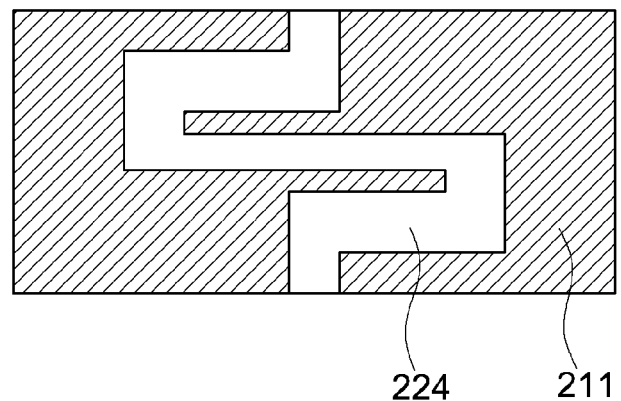
FIG. 11 is a plan view showing an internal connection conductor usable together with the first to third internal electrodes shown in FIGS. 10A through 10C.

FIG. 11 is a plan view showing an internal connection conductor usable together with the first to third internal electrodes shown in FIGS. 10A through 10C.

Referring to FIGS. 10A through 11, the first capacitor part may be formed to include the first internal electrode 221 exposed to the first and second end surfaces 1 and 2 and the second internal electrode 222 having the lead-out portion 222a exposed to the second main surface 6, and the second capacitor part may be formed to include the second internal electrode 222 and the third internal electrode 223 having the lead-out portion 223a exposed to the first main surface 5.

In addition, the internal connection conductor 224 may be formed in the ceramic body 210 and may have a form in which the internal connection conductor 224 is exposed to the first and second main surfaces 5 and 6.

Figure 12:
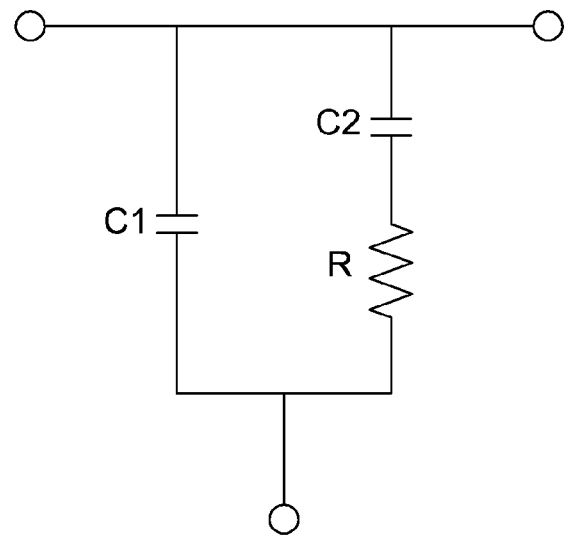
FIG. 12 is an equivalent circuit diagram of the multilayer ceramic capacitor shown in FIG. 8.

FIG. 12 is an equivalent circuit diagram of the multilayer ceramic capacitor shown in FIG. 8.

Referring to FIG. 12, the first capacitor part including the first internal electrode 221 exposed to the first and second end surfaces 1 and 2 and the second internal electrode 222 having the lead-out portion 222a exposed to the second main surface 6, and the second capacitor part including the second internal electrode 222 and the third internal electrode 223 having the lead-out portion 223a exposed to the first main surface 5 may be connected to each other in parallel.

In addition, the internal connection conductor 224 may be connected to the second capacitor part in series, wherein the second capacitor part includes the second internal electrode 222 and the third internal electrode 223 having the lead-out portion 223a exposed to the first main surface 5.

As described above, the multilayer ceramic capacitor according to another embodiment of the present invention may have two types of capacitors and one resistor and may control respective values thereof.

Board for Mounting Multilayer Ceramic Capacitor

Figure 13:
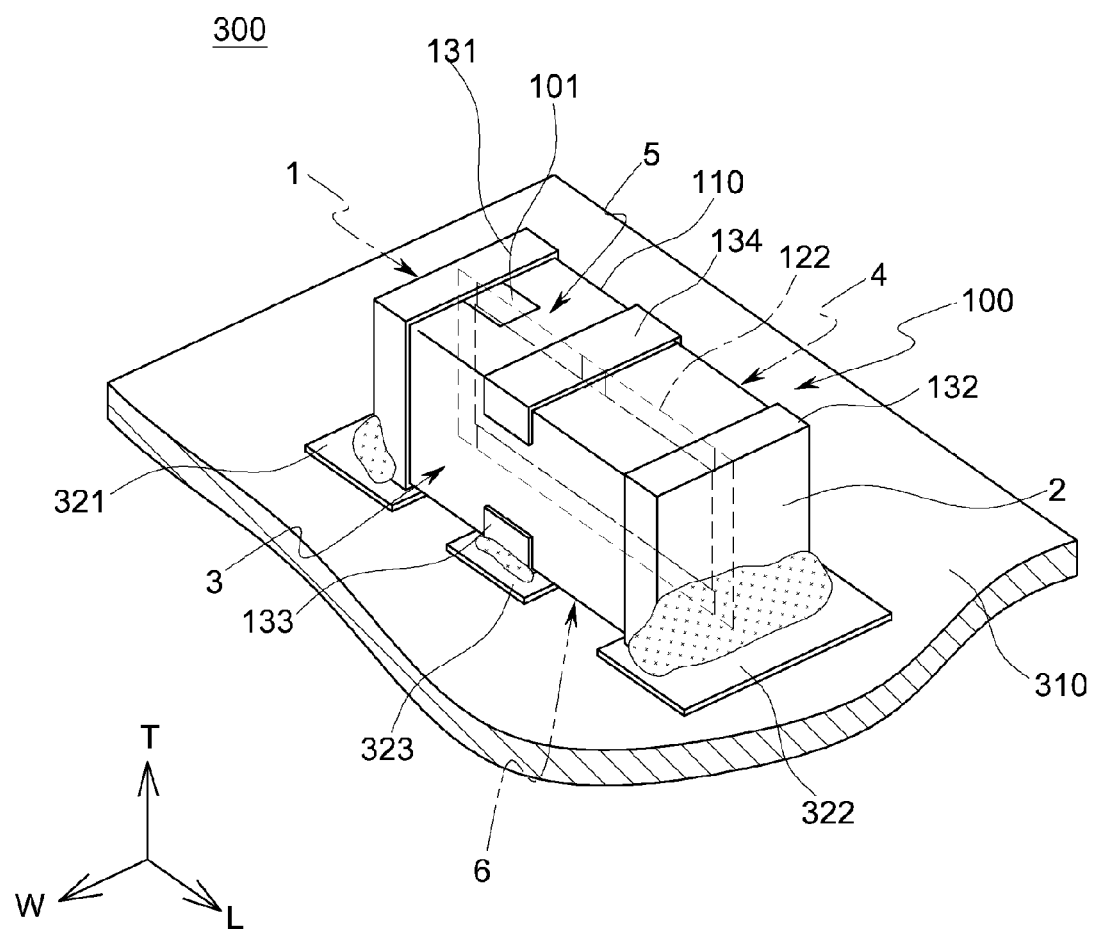
FIG. 13 is a perspective view showing a form in which the multilayer ceramic capacitor of FIG. 1 is mounted on a printed circuit board.

FIG. 13 is a perspective view showing a form in which the multilayer ceramic capacitor of FIG. 1 is mounted on a printed circuit board.

Referring to FIG. 13, a board for mounting the multilayer ceramic capacitor 100 according to the embodiment of the present invention includes a printed circuit board 310 on which the multilayer ceramic capacitor 100 is mounted to be perpendicular thereto, and first to third electrode pads 321, 322, and 323 formed on an upper surface of the printed circuit board 310 to be spaced apart from each other.

In this case, the multilayer ceramic capacitor 100 may be electrically connected to the printed circuit board 310 by soldering in a state in which the first and second external electrodes 131 and 132 are disposed on the first and second electrode pads 321 and 322 to be in contact with the first and second electrode pads 321 and 322 and the third external electrode 133 is disposed on the third electrode pad 323 to be in contact with the third electrode pad 323.

Although not explicitly shown in the drawing, the multilayer ceramic capacitor mounted on the board 300 for mounting the multilayer ceramic capacitor may be the multilayer ceramic capacitor 200 according to another embodiment of the present invention.

Here, descriptions overlapped with the features of the multilayer ceramic capacitor according to the foregoing embodiment of the present invention described above, except for the description described above will be omitted.

As set forth above, according to the embodiment of the present invention, the multilayer ceramic capacitor may have one type of ESR and one type of capacitor and may control respective values thereof.

Thereby, the decrease and the adjustment of the impedance may be easily implemented in the frequency region wider than the structure according to the related art and the mounting space and cost may be decreased according to the decrease in components.

In addition, the ESR may be controlled in the multilayer ceramic capacitor, a main component in a power integrity design, such that it may be effective in the power integrity design.

In addition, according to the embodiment of the present invention, by the internal resistance of the multilayer ceramic capacitor, leak current may be easily detected and the decrease in reliability may be prevented even in the case of sudden decrease in insulation resistance such as a crack or the like due to external stress, such that reliability may be excellent.

According to the related art, although a separate external resistor has been required to detect leak current, according to the embodiment of the present invention, leak current may be detected using the internal resistor in the multilayer ceramic capacitor, such that manufacturing costs and mounting space of the components may be decreased.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor, comprising:
a ceramic body including a plurality of dielectric layers and having first and second main surfaces opposing each other in a thickness direction of the ceramic body, first and second side surfaces opposing each other in a width direction thereof, and first and second end surfaces opposing each other in a length direction thereof;
a capacitor part formed in the ceramic body and including a first internal electrode exposed to the first and second end surfaces and a second internal electrode having a lead-out portion exposed to the first main surface;
an internal connection conductor formed in the ceramic body and exposed to the first and second main surfaces; and
first to fourth external electrodes formed on outer surfaces of the ceramic body and electrically connected to the first and second internal electrodes and the internal connection conductor,
wherein the internal connection conductor is connected to the capacitor part in series.

2. The multilayer ceramic capacitor of claim 1, wherein the first and second external electrodes are disposed on the first and second end surfaces of the ceramic body opposing each other, and the third and fourth external electrodes are disposed on the first and second main surfaces of the ceramic body opposing each other.

3. The multilayer ceramic capacitor of claim 1, wherein the internal connection conductor is connected to the second internal electrode through the fourth external electrode.

4. The multilayer ceramic capacitor of claim 1, wherein the ceramic body further includes a dummy pattern formed on the first main surface.

5. The multilayer ceramic capacitor of claim 1, wherein an equivalent series resistor (ESR) of the multilayer ceramic capacitor is adjusted by the internal connection conductor.

6. The multilayer ceramic capacitor of claim 1, wherein the first internal electrode is further exposed to the first and second main surfaces.

7. A multilayer ceramic capacitor, comprising:
a ceramic body including a plurality of dielectric layers and having first and second main surfaces opposing each other in a thickness direction of the ceramic body, first and second side surfaces opposing each other in a width direction thereof, and first and second end surfaces opposing each other in a length direction thereof;
a first capacitor part formed in the ceramic body and including a first internal electrode exposed to the first and second end surfaces and a second internal electrode having a lead-out portion exposed to the second main surface, and a second capacitor part including the second internal electrode and a third internal electrode having a lead-out portion exposed to the first main surface;
an internal connection conductor formed in the ceramic body and exposed to the first and second main surfaces; and
first to fourth external electrodes formed on outer surfaces of the ceramic body and electrically connected to the first to third internal electrodes and the internal connection conductor,
wherein the internal connection conductor is connected to the second capacitor part in series.

8. The multilayer ceramic capacitor of claim 7, wherein the first and second external electrodes are disposed on the first and second end surfaces of the ceramic body opposing each other, and the third and fourth external electrodes are disposed on the first and second main surfaces of the ceramic body opposing each other.

9. The multilayer ceramic capacitor of claim 7, wherein the internal connection conductor is connected to the second internal electrode through the third external electrode.

10. The multilayer ceramic capacitor of claim 7, wherein the internal connection conductor is connected to the third internal electrode through the fourth external electrode.

11. The multilayer ceramic capacitor of claim 7, wherein the ceramic body further includes a dummy pattern formed on the first main surface.

12. The multilayer ceramic capacitor of claim 7, wherein an equivalent series resistor (ESR) of the multilayer ceramic capacitor is adjusted by the internal connection conductor.

13. A board for mounting a multilayer ceramic capacitor, the board comprising:
a printed circuit board having first and second electrode pads thereon; and
the multilayer ceramic capacitor of claim 1 installed on the printed circuit board.

14. A board for mounting a multilayer ceramic capacitor, the board comprising:
a printed circuit board having first and second electrode pads thereon; and
the multilayer ceramic capacitor of claim 2 installed on the printed circuit board.

15. A board for mounting a multilayer ceramic capacitor, the board comprising:
a printed circuit board having first and second electrode pads thereon; and
the multilayer ceramic capacitor of claim 3 installed on the printed circuit board.

16. A board for mounting a multilayer ceramic capacitor, the board comprising:
a printed circuit board having first and second electrode pads thereon; and
the multilayer ceramic capacitor of claim 4 installed on the printed circuit board.

17. A board for mounting a multilayer ceramic capacitor, the board comprising:
a printed circuit board having first and second electrode pads thereon; and
the multilayer ceramic capacitor of claim 5 installed on the printed circuit board.

18. A board for mounting a multilayer ceramic capacitor, the board comprising:
a printed circuit board having first and second electrode pads thereon; and
the multilayer ceramic capacitor of claim 6 installed on the printed circuit board.

19. A board for mounting a multilayer ceramic capacitor, the board comprising:
a printed circuit board having first and second electrode pads thereon; and
the multilayer ceramic capacitor of claim 7 installed on the printed circuit board.

* * * * *